United States Patent
Elkhatib et al.

(10) Patent No.: US 9,949,031 B2
(45) Date of Patent: Apr. 17, 2018

(54) CLASS-D AMPLIFIER WITH PULSE DENSITY MODULATION OUTPUT FEEDBACK FOR HIGHER PERFORMANCE ACOUSTIC ECHO CANCELLER

(71) Applicant: SYNAPTICS INCORPORATED, San Jose, CA (US)

(72) Inventors: Mouna Elkhatib, Tustin, CA (US); Trausti Thormundsson, Irvine, CA (US); Jonathan Chien, Tustin, CA (US); Yair Kerner, Kiryat Ono (IL)

(73) Assignee: SYNAPTICS INCORPORATED, San Jose, CA (US)

( * ) Notice: Subject to any disclaimer, the term of this patent is extended or adjusted under 35 U.S.C. 154(b) by 522 days.

(21) Appl. No.: 13/860,477

(22) Filed: Apr. 10, 2013

(65) Prior Publication Data
US 2013/0266158 A1    Oct. 10, 2013

Related U.S. Application Data

(60) Provisional application No. 61/622,485, filed on Apr. 10, 2012.

(51) Int. Cl.
| | | |
|---|---|---|
| *H04R 3/12* | (2006.01) | |
| *H04R 3/02* | (2006.01) | |
| *H03F 3/217* | (2006.01) | |

(52) U.S. Cl.
CPC .............. *H04R 3/12* (2013.01); *H03F 3/2175* (2013.01); *H04R 3/02* (2013.01); *H04R 2499/15* (2013.01)

(58) Field of Classification Search
CPC ........ H04R 3/12; H04R 3/02; H04R 2499/15; H03F 3/2175
See application file for complete search history.

(56) References Cited

U.S. PATENT DOCUMENTS

| | | | | |
|---|---|---|---|---|
| 3,667,046 | A * | 5/1972 | Schoolcraft | 375/308 |
| 6,049,606 | A * | 4/2000 | Ding et al. | 379/406.08 |
| 2005/0069161 | A1* | 3/2005 | Kaltenbach et al. | 381/312 |
| 2007/0103234 | A1* | 5/2007 | Maejima et al. | 330/207 A |
| 2010/0204996 | A1* | 8/2010 | Zeng et al. | 704/500 |
| 2011/0110532 | A1* | 5/2011 | Svendsen | H04M 9/082 381/93 |
| 2012/0226502 | A1* | 9/2012 | Ouchi | H04N 5/4403 704/275 |
| 2012/0276912 | A1* | 11/2012 | Zhang et al. | 455/450 |

OTHER PUBLICATIONS

Wikipedia.org, pulse-density modulation, 4 pages.*

* cited by examiner

*Primary Examiner* — Ping Lee
(74) *Attorney, Agent, or Firm* — Haynes and Boone, LLP

(57) ABSTRACT

A system for processing audio data comprising an amplifier configured to receive an audio signal and to perform nonlinear processing on the audio signal. An encoder coupled to the amplifier, the encoder configured to receive the nonlinearly processed audio signal and to encode the nonlinearly processed audio signal into a data transmission format. A transmitter configured to receive and transmit the encoded nonlinearly processed audio signal. A receiver configured to receive the transmitted encoded nonlinearly processed audio signal and to decode the encoded nonlinearly processed audio signal. A digital voice processor configured to receive the nonlinearly processed audio signal and to use the nonlinearly processed audio signal for echo estimation and to subsequently subtract the estimated echo signal from a microphone signal.

17 Claims, 3 Drawing Sheets

US 9,949,031 B2

CLASS-D AMPLIFIER WITH PULSE DENSITY MODULATION OUTPUT FEEDBACK FOR HIGHER PERFORMANCE ACOUSTIC ECHO CANCELLER

RELATED APPLICATIONS

The present application claims benefit of U.S. Provisional Patent Application No. 61/622,485, filed Apr. 10, 2012, which is hereby incorporated by reference for all purposes as if set forth herein in its entirety.

TECHNICAL FIELD

The present disclosure relates generally to a system for processing audio data, and more specifically to a class-D amplifier with pulse density modulation output feedback for providing a higher performance acoustic echo canceller.

BACKGROUND OF THE INVENTION

Systems for processing audio data to perform acoustic echo cancellation are used in many applications, but in the context of systems for providing verbal controls to audio systems, such systems have had limited use. This limited use arises from difficulties in processing verbal controls in the ambient environment where the audio system is being used.

SUMMARY OF THE INVENTION

In accordance with an exemplary embodiment of the present disclosure, a system for processing audio data is provided that includes an amplifier, such as a class-D amplifier, that receives an audio signal and performs non-linear processing on the audio signal. An encoder coupled to the amplifier receives the nonlinearly processed audio signal and encodes the nonlinearly processed audio signal into a data transmission format. A transmitter receives and transmits the encoded nonlinearly processed audio signal, and a receiver receives the transmitted encoded nonlinearly processed audio signal and decodes the encoded nonlinearly processed audio signal. A digital voice processor receives the nonlinearly processed audio signal and uses the nonlinearly processed audio signal as an input to an acoustic echo cancellation module or algorithm that subtracts an estimated echo signal from a microphone signal.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
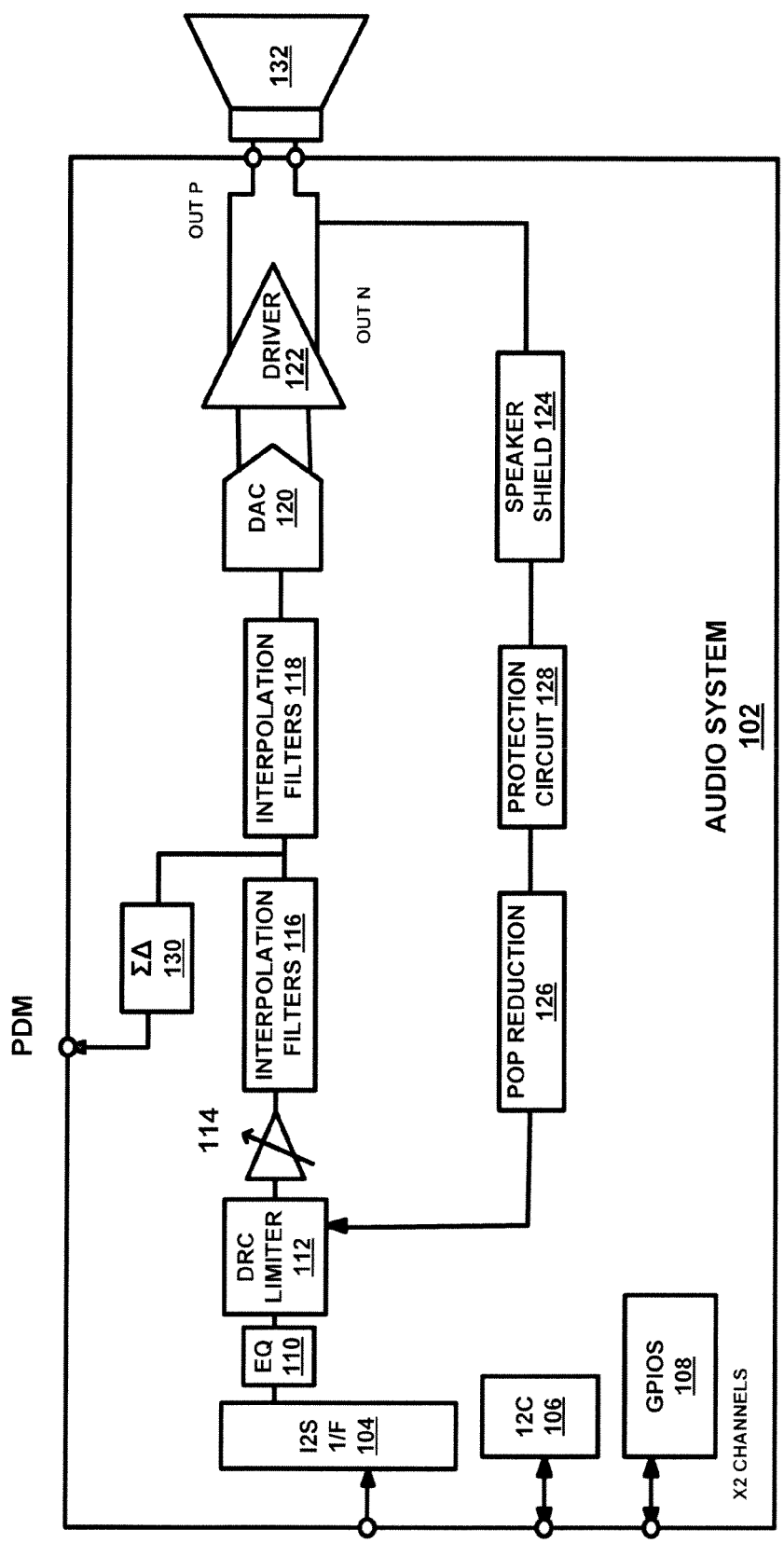
FIG. 1 is a diagram of a system for providing direct feedback from the amplifier in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

Digital signal processor (DSP) functions can be included in class D amplifier devices, such as equalizers and dynamic range compressors. These class D amplifier devices can be used in a number of different applications, such as televisions, audio systems, gaming systems, desktop computers, notebook computers, tablet computers and other suitable systems. Several of the functions that can be provided include speaker curve compensation, speaker protection and output power level adjustments. In addition, there are other speaker protection mechanisms that adjust the audio level based on the speaker amplifier outputs. These DSP function can be implemented in the amplifier device so as not to add processing load to a processor that is also providing power sequencing, functional block enabling, firmware setups and other system level setups.

One issue resulting from this architecture is that the amplifier can include time varying processing and non-linear processing, which can cause variations in the echo path that are hard for an acoustic echo cancellation to track.

Another issue that results with this architecture is that the microphone can be placed in a separate unit other than the speakers. For example, the microphone can be placed inside a remote control unit, where it is closer to the user than if the microphone is located within the equipment enclosure, which can be several meters away. In this application, the distance between the microphone and the speakers can change, which results in a variation in the time required for sound to travel from the speakers to the microphone. Yet another issue can occur when the speakers are located in a stand-alone unit, such as outside of the equipment enclosure, and where the microphone is located within the equipment enclosure or the remote control. In these different embodiments, an acoustic echo canceller (AEC) that is located at the microphone will function better than an AEC in other locations.

Loopback streaming is suggested by Microsoft for personal computing systems to support offloading of audio processing from the host CPU to the hardware. This approach assumes that the echo cancellation will still be performed on the host CPU, though, and that it will use the same interface for loopback streaming as the interface for sending the playback stream to the device. An example of this recommendation from Microsoft can be found in "Exposing Hardware Offloaded Audio Processing in Windows v0.8.xps," which is hereby incorporated by reference for all purposes as if set forth herein in its entirety. In order to accommodate acoustic echo cancellation in other embodiments, it is necessary to add a feedback signal from the amplifier after all non-linear signal processing has been performed. This configuration will provide the echo reference and remove the effect of any processing done by the amplifier on the acoustic echo canceller performance.

FIG. 1 is a diagram of a system 100 for providing direct feedback from the amplifier in accordance with an exemplary embodiment of the present disclosure. In addition, pulse density modulation (PDM) can be used, which only requires a single wire or other data conductor or data channel to transport the data. The use of a single wire/data channel avoids complicating the system with multiple wires/data channels, and limits the PDM output to less than 3 Mhz to minimize EMI effects. Pulse width modulation (PWM), delta-sigma modulation or other suitable types of modulation can also or alternatively be used.

System 100 includes audio system 102 having a feedback connection from Class-D amplifier (driver) 122 to dynamic range compressor (DRC limiter) 112, therefore the post-DRC signal is sent to sigma-delta modulator 130, so as to provide a feedback signal after all non-linear processing has been performed. Class-D amplifier 122 is coupled to DRC limiter 112 through speaker shield 124, protection circuit 128 and pop reduction 126, or other suitable systems or components. Class-H amplifiers or other suitable types of amplifiers can also or alternatively be used.

System 100 can be implemented in hardware or a suitable combination of hardware and software. As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

System 100 also includes general purpose input/output GPIOS 108, inter-IC communication (I2C) 106 and 12S interface 104, which is coupled to equalizer 110 which equalizes a received audio signal and provides the audio signal to dynamic range compressor/limiter 112, which also processes the feedback signal from driver 122. The output of dynamic range compressor/limiter 112 is provided to variable amplifier 114, and interpolation filters 116 processes the signal and provides the processed signal to sigma-delta converter 130, which generates the PWM signal for the voice input processor. Interpolation filters 118 further processes the audio signal and provides the processed audio signal to digital to analog converter 120, which provides the analog audio signal to speaker 132.

In operation, system 100 generates a PDM signal for use in acoustic echo cancellation so as to allow the effects of non-linear processing that is performed by DRC limiter 112 and variable amplifier 114 to be compensated for. In addition to providing a simpler interface, the disclosed exemplary embodiment allows the PDM signal to be sent directly to the voice input processor rather than needing to route the signal through the host, such as to allow the signal to be transmitted to the voice input processor in cases where it is located in a different unit than the playback amplifier.

Figure 2:
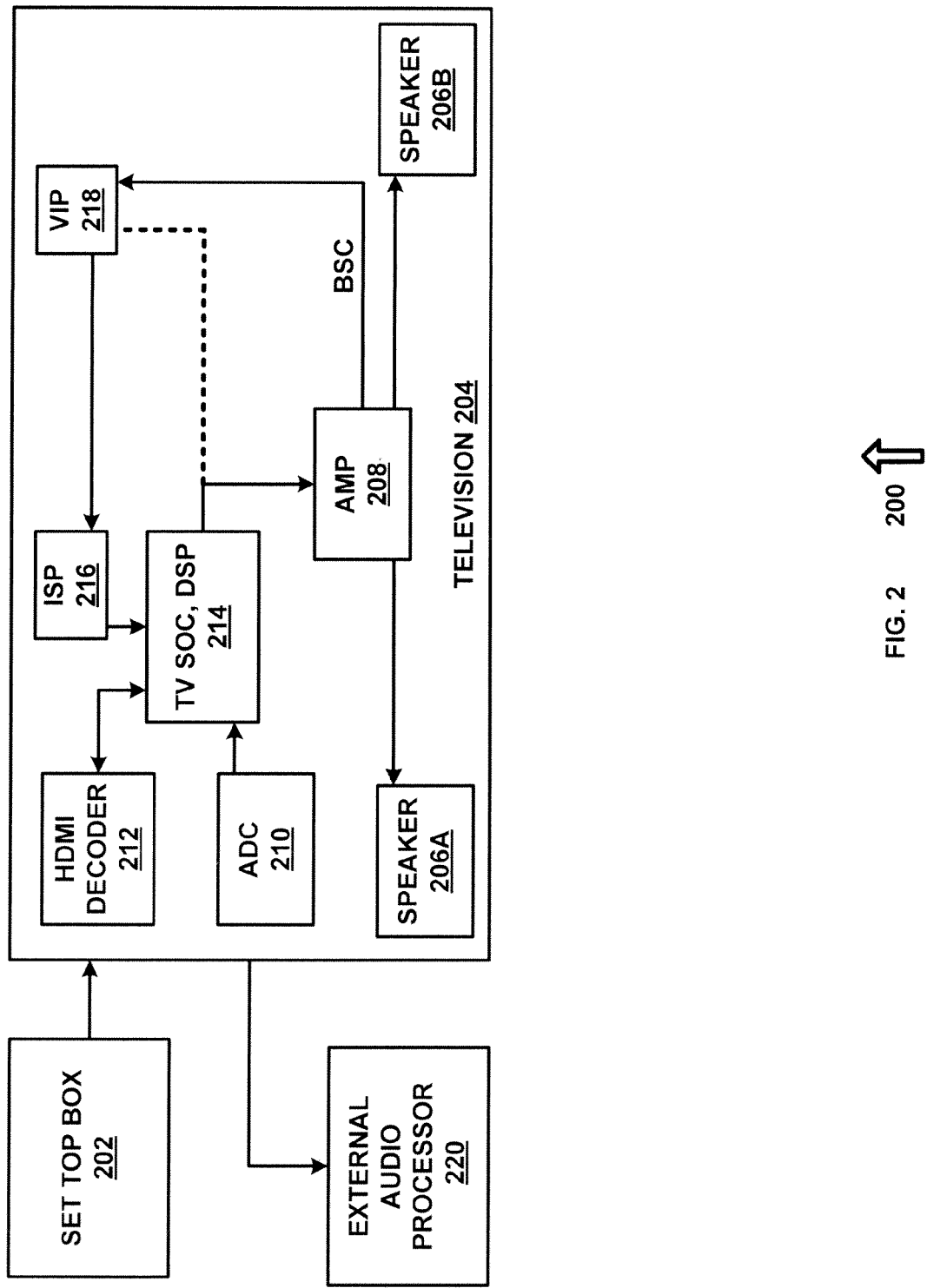
FIG. 2 is a diagram of a system showing one possible implementation of this solution in accordance with an exemplary embodiment of the present disclosure.

FIG. 2 is a diagram of a system 200 showing a television with direct feedback from the amplifier in accordance with an exemplary embodiment of the present disclosure. System 200 can be implemented in hardware or a suitable combination of hardware and software.

The modified wiring in the home audio topology can be configured as shown in system 200, where the dashed line from the TV system on a chip (SOC) and digital signal processor (DSP) 214 to voice input processor (VIP) 218 shows the usual signal path, which cannot be used due to nonlinear processing that occurs within amplifier 208. That output from TV SOC, DSP 214 represents the existing path for providing feedback that omits the nonlinear processing of the class-D amplifier. Instead, a direct bit stream connection BSC is provided from amplifier 208 to VIP 218, which can operate at a suitable frequency, such as 3 Mhz or less. BSC can be transmitted using pulse width modulation (PWM) or other suitable forms of modulation, and can be transmitted by a wire line transmitter, a wireless transmitter, an infrared transmitter or in other suitable manners.

VIP 218 includes a receiver configured to receive and decodes the PWM signal received from AMP 208 and can generate a playback signal from the decoded signal. The receiver can be a wire line PWM receiver, a wireless PWM receiver, an infrared PWM receiver or other suitable receivers. VIP 218 can also receive an ambient audio signal from one or more microphones, and can cancel the received playback signal from the ambient audio signal using acoustic echo cancellation processing or other suitable processing. Because the received playback signal accurately represents the signal generated by the speaker, VIP 218 is able to more accurately cancel the ambient audio signals that result from the speaker signal. Image signal processor (ISP) 216 receives image data from a camera and the processed signal from the VIP and can perform automatic speech recognition processing or other suitable processing, such as voice over Internet Protocol (VoIP) processing.

In configurations where the microphone and speakers are located in different units, the feedback signal from the digital amplifier can be connected to a wireless or infrared transmitter. A corresponding receiver on the unit that contains the microphone input processing will receive the reference playback signal and can provide that signal to the input processing device for usage by the AEC.

Set top box 202 is coupled to television 204, and provides audio data, video data and other suitable data. HDMI decoder 212 and analog to digital converter 210 can receive input audio and video data, such as from set top box 202 or other suitable sources, and TV SOC, DSP 214 processed the audio signal and transmits the processed audio signal to amplifier 208, which performs additional nonlinear processing and provides the amplified audio signal to speakers 206A and 206B. Likewise, an external audio processor 220 such as a sound bar, audiovisual receiver, media streamer or other suitable systems can also or alternatively be provided.

When the input to an acoustic echo canceller is the same as the input to the digital amplifier, then the digital amplifier is located in the echo path seen by an acoustic echo canceller running on the VIP or in software on the television data processing system, which can be implemented as a system on a chip (SoC). If the digital amplifier performs time varying processing or non-linear processing, that processing can cause variations in the echo path that will be hard for the AEC to track.

The echo canceller can also or alternatively use linear filters to predict and subtract the echo from the microphone signal. These linear filters can be automatically adapted to the echo path. If there are dynamic processing elements in the echo path, then the acoustic echo canceller has to be configured to make the linear filters track the changes of these dynamic processing elements, otherwise the prediction of the echo will be incorrect and may result in higher residual echo. Configuring the AEC track these types of fast changes can be challenging and can place constrains on the AEC design.

If there is a non-linear processing element in the echo path, then the linear part of the AEC will typically not be able to predict the echo resulting from non-linear components. The non-linear components can appear to be near end speech to the AEC, which may allow such signals to pass, thus increasing the residual echo. Configuring the AEC to process non-linear elements in the echo path is computationally intensive, and when the non-linearity is coupled with dynamic changes, then processing becomes even more difficult.

Obtaining the echo reference in the manner disclosed herein allows the processing of the digital amplifier to be removed from the echo path. Processing performed by the digital amplifier will therefore not have effects on the acoustic echo canceller performance. In addition to being a simpler interface, PDM allows the signal to be sent directly to the VIP rather than needing to go through the host, and can be extended to sending the signal to the VIP in cases where the VIP is located in a different unit than the playback amplifier.

Figure 3:
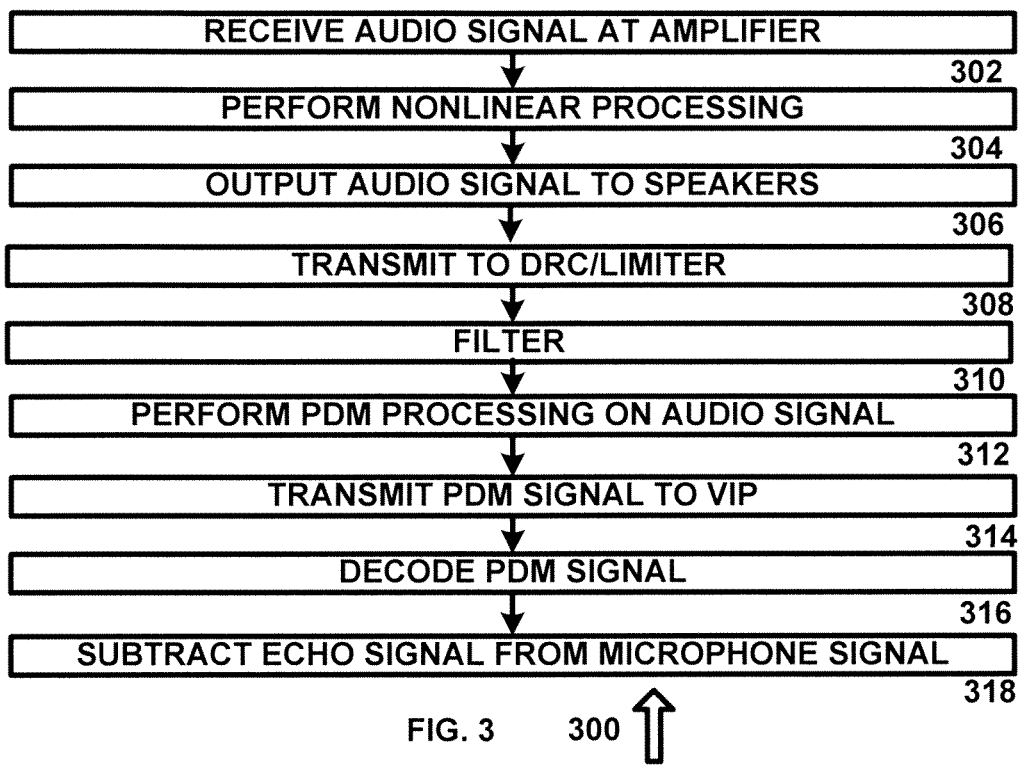
FIG. 3 is a diagram of an algorithm for processing output from a class-D or other suitable amplifier in accordance with an exemplary embodiment of the present disclosure.

FIG. 3 is a diagram of an algorithm 300 for processing output from a class-D or other suitable amplifier in accordance with an exemplary embodiment of the present disclosure. Algorithm 300 can be implemented in hardware or a suitable combination of hardware and software.

Algorithm 300 begins at 302, where an audio signal is received at an amplifier that performs additional nonlinear processing on the audio signal, such as a class-D amplifier or other suitable amplifiers. The algorithm then proceeds to 304, where the nonlinear processing is performed. In one exemplary embodiment, the nonlinear processing can include speaker curve compensation, speaker protection, output power level adjustments or other suitable processing. The algorithm then proceeds to 306.

At 306, the audio signal is output to one or more speakers. The algorithm then proceeds to 308, where the processed audio signal is transmitted to a dynamic range compensation/limiter for processing. The algorithm then proceeds to 310, where the processed audio signal is filtered, and the algorithm then proceeds to 312 where PDM processing is performed on the audio signal to encode the audio data. In one exemplary embodiment, 306 and 308 can be performed in parallel. The algorithm then proceeds to 310.

At 310, the PDM signal is transmitted to a digital voice processor such as a VIP chip. In one exemplary embodiment, the data channel used to conduct the PDM signal can be a hardwired data channel such as a conductor, a wireless data channel such as an infrared or wireless data channel, or other suitable data channels. The algorithm then proceeds to 312, where the PDM signal is decoded, and at 314, the processed audio signal is used for echo estimation at an acoustic echo cancellation module or algorithm and that estimated echo signal is subsequently subtracted from the audio signal received at a microphone to compensate for the echo of the nonlinearly processed signal in the microphone signal.

In operation, algorithm 300 can be used to compensate for nonlinear processing that is performed on an audio signal that would not otherwise be properly compensated for in an AEC. Although algorithm 300 is shown as a flow chart, algorithm 300 can also or alternatively be implemented as a state diagram or in other suitable manners.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for processing audio data comprising:
   an amplifier directly coupled to a loudspeaker, the amplifier configured to receive an audio signal, perform nonlinear processing on the audio signal, and output the nonlinearly processed audio signal to drive the loudspeaker;
   an encoder electrically coupled to the amplifier output, the encoder configured to receive the nonlinearly processed audio signal output from the amplifier and to encode the nonlinearly processed audio signal into a data transmission format;
   a transmitter coupled to the encoder and configured to receive and transmit the encoded nonlinearly processed audio signal;
   a receiver configured to receive the transmitted encoded nonlinearly processed audio signal and to decode the encoded nonlinearly processed audio signal; and
   a digital voice processor configured to receive the decoded nonlinearly processed audio signal and to use the decoded nonlinearly processed audio signal for echo estimation at an acoustic echo cancellation module or algorithm and to subsequently subtract that estimated echo signal from a microphone signal, the microphone signal including echo interference generated from the loudspeaker.

2. The system of claim 1 wherein the encoder performs pulse density modulation encoding of the nonlinearly processed audio signal.

3. The system of claim 1 wherein the transmitter is one of a wire line data transmitter, an infrared data transmitter or a wireless data transmitter.

4. The system of claim 1 wherein the amplifier is a class D amplifier.

5. The system of claim 1 wherein the amplifier performs one or more of speaker curve compensation processing, speaker protection processing or output power level adjustment processing.

6. A method for processing audio data comprising:
   receiving an audio signal at an amplifier;
   performing nonlinear processing on the audio signal using the amplifier;
   driving a loudspeaker directly coupled to an output of the amplifier by feeding the nonlinear processed audio signal from the amplifier to the loudspeaker;
   receiving the nonlinearly processed audio signal output from the amplifier at an encoder coupled to the output of the amplifier;
   encoding the nonlinearly processed audio signal into a data transmission format using the encoder;

transmitting the encoded nonlinearly processed audio signal by a transmitter coupled to the encoder;

receiving the transmitted encoded nonlinearly processed audio signal at a receiver;

decoding the encoded nonlinearly processed audio signal;

receiving the decoded nonlinearly processed audio signal at a digital voice processor; and using the decoded nonlinearly processed audio signal for echo estimation at an acoustic echo cancellation module or algorithm and subsequently subtracting that estimated echo signal from a microphone signal at a digital voice processor, wherein the microphone signal includes echo interference generated from the loudspeaker.

7. The method of claim 6 wherein encoding the nonlinearly processed audio signal into a data transmission format using the encoder comprises encoding the nonlinearly processed audio signal into a pulse density modulated data transmission format using the encoder.

8. The method of claim 6 wherein transmitting the encoded nonlinearly processed audio signal comprises transmitting the encoded nonlinearly processed audio signal using one of a wire line data transmitter, an infrared data transmitter or a wireless data transmitter.

9. The method of claim 6 further comprising: amplifying the nonlinearly processed audio signal using a class D amplifier; and providing the amplified nonlinearly processed audio signal to one or more speakers.

10. The method of claim 6 wherein performing nonlinear processing on the audio signal using the amplifier further comprises performing speaker curve compensation processing.

11. The method of claim 6 wherein performing nonlinear processing on the audio signal using the amplifier further comprises performing speaker protection processing.

12. The method of claim 6 wherein performing nonlinear processing on the audio signal using the amplifier further comprises performing output power level adjustment processing.

13. A system for processing audio data comprising:

means for receiving an audio signal, performing nonlinear processing on the audio signal, and amplifying the nonlinearly processed audio signal for output to a loudspeaker directly coupled thereto;

means for receiving the nonlinearly processed audio signal output from the means for receiving an audio signal and encoding the nonlinearly processed audio signal into a data transmission format;

means for transmitting the encoded nonlinearly processed audio signal;

means for receiving the transmitted encoded nonlinearly processed audio signal and decoding the encoded nonlinearly processed audio signal;

means for using the nonlinearly processed audio signal for estimation of an echo signal; and means for subtracting the estimated echo signal from a microphone signal, wherein the microphone signal includes echo interference generated from the loudspeaker.

14. The system of claim 13 wherein the means for encoding performs pulse density modulation encoding of the nonlinearly processed audio signal.

15. The system of claim 13 wherein the means for transmitting is one of a wire line data transmitter, an infrared data transmitter or a wireless data transmitter.

16. The system of claim 13 wherein the means for receiving an audio signal and performing nonlinear processing on the audio signal comprises a class D amplifier.

17. The system of claim 16 wherein the amplifier performs one or more of speaker curve compensation processing, speaker protection processing or output power level adjustment processing.

* * * * *